(12) United States Patent
Lee et al.

(10) Patent No.: US 8,871,543 B2
(45) Date of Patent: Oct. 28, 2014

(54) APPARATUS FOR FORMING ORGANIC LAYER AND METHOD OF MANUFACTURING ORGANIC LIGHT EMITTING DISPLAY USING THE SAME

(71) Applicant: Samsung Display Co., Ltd., Yongin (KR)

(72) Inventors: Sang Woo Lee, Yongin (KR); Kyul Han, Yongin (KR); Hye-Yeon Shim, Yongin (KR); Hyo-Yeon Kim, Yongin (KR); Heun Seung Lee, Yongin (KR); Ha Jin Song, Yongin (KR); Ji Hwan Yoon, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/910,406

(22) Filed: Jun. 5, 2013

(65) Prior Publication Data

US 2014/0127843 A1    May 8, 2014

(30) Foreign Application Priority Data

Nov. 7, 2012   (KR) .................. 10-2012-0125717

(51) Int. Cl.
*H01L 21/00* (2006.01)
*H01L 51/56* (2006.01)
*H01L 27/32* (2006.01)

(52) U.S. Cl.
CPC ............ *H01L 27/3244* (2013.01); *H01L 51/56* (2013.01); *Y10S 438/907* (2013.01)
USPC ......... 438/34; 438/22; 438/907; 257/E21.001

(58) Field of Classification Search
USPC .......................................... 438/907
See application file for complete search history.

(56) References Cited

U.S. PATENT DOCUMENTS

| | | | |
|---|---|---|---|
| 6,482,556 B1 | 11/2002 | Ohno et al. | |
| 7,955,869 B2* | 6/2011 | Takahiro et al. | 438/3 |
| 2006/0188697 A1* | 8/2006 | Lee | 428/156 |
| 2012/0025182 A1* | 2/2012 | Umeda et al. | 257/40 |
| 2013/0011958 A1* | 1/2013 | Roscheisen et al. | 438/85 |

FOREIGN PATENT DOCUMENTS

| | | |
|---|---|---|
| KR | 10-2001-0049939 | 6/2001 |
| KR | 10-2002-0069490 | 9/2002 |
| KR | 10-2010-0022701 | 3/2010 |

* cited by examiner

*Primary Examiner* — Angel Roman
(74) *Attorney, Agent, or Firm* — Knobbe Martens Olson & Bear LLP

(57) ABSTRACT

An organic layer forming apparatus includes a donor film supply part configured to supply a donor film. The donor film includes a base substrate, a transfer layer disposed on the base substrate, and a protective film disposed on the transfer layer. The apparatus also includes a protective film withdrawal part configured to remove the protective film from the donor film, a transfer printing process part configured to transfer the transfer layer of the donor film onto a transfer substrate to form a first organic layer, a first deposition part configured to form a second organic layer on the transfer layer through a first deposition process, a second deposition part configured to form a third organic layer on the transfer layer through a second deposition process, and a donor film withdrawal part configured to withdraw the donor film.

9 Claims, 6 Drawing Sheets

APPARATUS FOR FORMING ORGANIC LAYER AND METHOD OF MANUFACTURING ORGANIC LIGHT EMITTING DISPLAY USING THE SAME

CROSS-REFERENCE TO RELATED APPLICATIONS

This U.S. non-provisional patent application claims priority under 35 U.S.C. §119 of Korean Patent Application No. 10-2012-0125717, filed on Nov. 7, 2012, the content of which is herein incorporated by reference in its entirety.

BACKGROUND

1. Field

The present disclosure relates to an apparatus of forming an organic layer, which is capable of performing a deposition process and a transfer printing process together to form the organic layer, and a method of manufacturing an organic light emitting display using the same organic layer.

2. Description of the Related Technology

In an organic light emitting display, a hole and an electron are injected into an organic layer through an anode and a cathode, respectively, and are recombined in the organic layer to generate an exciton. The exciton emits as light energy discharged when an excited state returns to a ground state.

To realize color using the organic light emitting display, the organic layer typically includes red, green, and blue light emitting layers. The red, green, and blue light emitting layers are generally formed through a deposition process or a transfer printing process.

The deposition process allows a deposition material evaporated from a deposition source unit to be deposited in a specific area, so that the organic layer is formed. However, the time required to form the organic layer using such a process is usually long.

The transfer printing process requires three separate transfer printing processes since red, green, and blue films are prepared and sequentially transferred. In this case, the transfer printing process is performed with respect to each color, and thus the transfer printing process is typically complicated. In addition, residues generated in the transfer printing process with respect to each color exert influence on the subsequent transfer printing process.

SUMMARY OF CERTAIN INVENTIVE ASPECTS

The present disclosure provides an apparatus of forming an organic layer, which is capable of performing a deposition process and a transfer printing process together.

The present disclosure provides a method of manufacturing an organic light emitting display using the organic layer forming apparatus.

Embodiments of the inventive concept provide an organic layer forming apparatus. The apparatus includes a donor film supply part configured to supply a donor film including a base substrate, a transfer layer disposed on the base substrate, and a protective film disposed on the transfer layer, a protective film withdrawal part configured to remove the protective film from the donor film, a transfer printing process part configured to transfer the transfer layer of the donor film onto a transfer substrate to form a first organic layer, a first deposition part configured to form a second organic layer on the transfer layer through a first deposition process, on which the first organic layer is formed, a second deposition part configured to form a third organic layer on the transfer layer through a second deposition process, on which the second organic layer is formed, and a donor film withdrawal part configured to withdraw the donor film. The donor film supply part, the protective film withdrawal part, the transfer printing process part, the first deposition part, the second deposition part, and the donor film withdrawal part are successively arranged to be connected in series.

The transfer substrate is configured to be transferred to the donor film withdrawal part from the donor film supply part after being entered into the donor film supply part.

The transfer printing process part and the donor film withdrawal part are maintained in a vacuum state lower than a vacuum state of the first and second deposition parts.

The apparatus further includes a process support part disposed between the protective film withdrawal part and the transfer printing process part, and the process support part is maintained in a vacuum state lower than that of the vacuum state of the first and second deposition parts.

Embodiments of the inventive concept provide a method of manufacturing an organic light emitting display. The method includes providing an insulating substrate including a plurality of pixel areas where a first electrode is formed, to a donor film supply part of an organic layer forming apparatus including the donor film supply part, a protective film withdrawal part, a transfer printing process part, a first deposition part, a second deposition part, and a donor film withdrawal part successively arranged to be connected in series, supplying a donor film including a base substrate, a transfer layer disposed on the base substrate, and a protective film disposed on the transfer layer using the donor film supply part, removing the protective film using the protective film withdrawal part, transferring the transfer layer onto the first electrode in a portion of the pixel areas using the transfer printing process part to form a first organic layer, depositing a first organic material onto the first electrode in another portion of the pixel areas using the first deposition part to form a second organic layer, depositing a second organic material onto the first electrode in the portion of the pixel areas using the second deposition part to form a third organic layer, and withdrawing the donor film using the donor film withdrawal part.

The method further includes irradiating a laser beam onto the base substrate.

According to the above, the organic layer forming apparatus may prevent the transfer layer from being contaminated, thereby preventing defects in the organic layer. Thus, the reliability of the organic light emitting display may be improved by the method using the organic layer forming apparatus.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION OF CERTAIN INVENTIVE EMBODIMENTS

Figure 1:
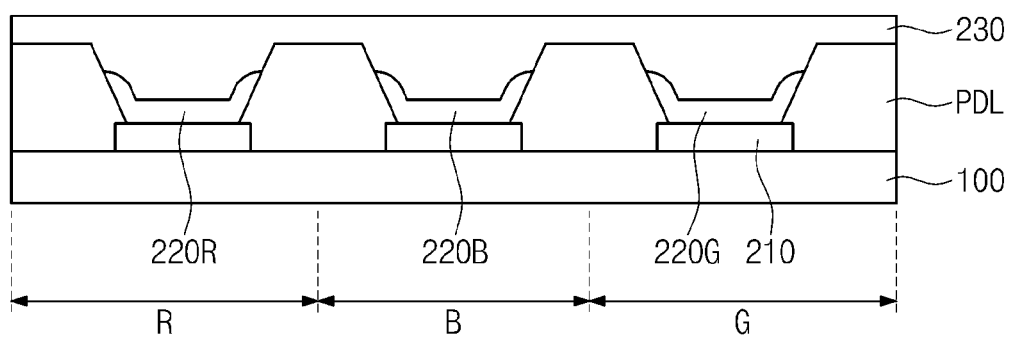
FIG. 1 is a cross-sectional view showing an organic light emitting display.

It will be understood that when an element or layer is referred to as being "on", "connected to" or "coupled to"

another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers generally refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a cross-sectional view showing an organic light emitting display.

Referring to FIG. 1, an organic light emitting display includes an insulating substrate 100 including a plurality of pixel areas R, G, and B and light emitting devices respectively disposed in the pixel areas R, G, and B. For instance, the insulating substrate 100 includes a red pixel area R, a green pixel area G, and a blue pixel area B. In addition, the light emitting device disposed in the red pixel area R emits a red light, the light emitting device disposed in the green pixel area G emits a green light, and the light emitting device disposed in the blue pixel area B emits a blue light.

Each light emitting device is defined by a pixel definition layer PDL and includes a first electrode 210, organic layers 220R, 220G, and 220B, and a second electrode 230.

One of the first electrode 210 and the second electrode 230 is an anode electrode to provide holes injected into the organic layers 220R, 220G, and 220R and the other one of the first electrode 210 and the second electrode 230 is a cathode electrode to provide electrons injected into the organic layers 220R, 220G, and 220R. As an example, in one embodiment, the first electrode 210 is the anode electrode and the second electrode 230 is the cathode electrode.

In addition, one of the first electrode 210 and the second electrode 230 is a transmission-type electrode and the other one of the first electrode 210 and the second electrode 230 is a reflection-type electrode.

For instance, when the organic light emitting display is a rear surface light emitting type display device, the first electrode 210 is the transmission-type electrode and the second electrode 220 is a reflection-type electrode. In one embodiment, the first electrode 210 may include a transparent conductive oxide, e.g., indium tin oxide, indium zinc oxide, aluminum zinc oxide, gallium-doped zinc oxide, zinc tin oxide, gallium tin oxide, or fluorine-doped tin oxide. In addition, the second electrode 230 may reflect light and include at least one of Mo, MoW, Cr, Al, AlNd, or Al alloy.

When the organic light emitting display is a front surface light emitting type display device, the first electrode 210 is the reflection-type electrode and the second electrode 230 is the transmission-type electrode. The first electrode 210 may have a multi-layer structure of a reflective conductive layer that reflects the light generated by the organic layers 220R, 220G, and 220B and a transmissive conductive layer that includes a transparent conductive oxide with a work function higher than that of the second electrode 230. As an example, the first electrode 210 may have a multi-layer structure of ITO/Ag/ITO, ITO/Ag/IZO, ITO/Ag-alloy/ITO or ITO/Ag—Pd—Cu alloy/ITO.

The second electrode 230 transmits the light generated by the organic layers 220R, 220G, and 220B and the light reflected by the first electrode 210. For example, the second electrode 230 includes at least one of Ag, Mg, Al, Pt, Pd, Au, Ni, Nd, Ir, Cr, Li, Ca, and an alloy thereof, which have a relatively small work function, and includes a metal thin layer disposed on the organic layers 220R, 220G, and 220B through which the light transmits. In addition, the second electrode 230 may further include a transparent conductive layer having a transparent conductive oxide and disposed on the metal thin layer so as to prevent an IR-drop of the metal thin layer.

The organic layers 220R, 220G, and 220B are disposed on the first electrode 210 exposed by the pixel definition layer PDL. The organic layers 220R, 220G, and 220B include at least a light emitting layer EML and have a multi-thin-layer structure. For example, the organic layers 220R, 220G, and 220B include a hole injection layer, a hole transport layer, the light emitting layer EML, a hole blocking layer, an electron transport layer, and an electron injection layer. The hole injection layer injects holes into the light emitting layer. The hole transport layer has superior hole-transport ability and blocks movement of electrons, which are not combined with the holes in the light emitting layer. Accordingly, the hole transport layer may increase the recombination chance between the holes and the electrons. The light emitting layer emits the light using the recombination of the holes and electrodes, which are injected thereinto. The hole blocking layer blocks movement of holes, which are not combined with the electrons in the light emitting layer. The electron transport layer transports the electrons to the light emitting layer. The electron injection layer injects the electrons into the light emitting layer.

In addition, the organic layers 220R, 220G, and 220B disposed in the red pixel area R emit the red light through the light emitting layer, the organic layers 220R, 220G, and 220B disposed in the green pixel area G emit the green light through the light emitting layer, and the organic layers 220R, 220G, and 220B disposed in the blue pixel area B emit the blue light through the light emitting layer.

Figure 2:
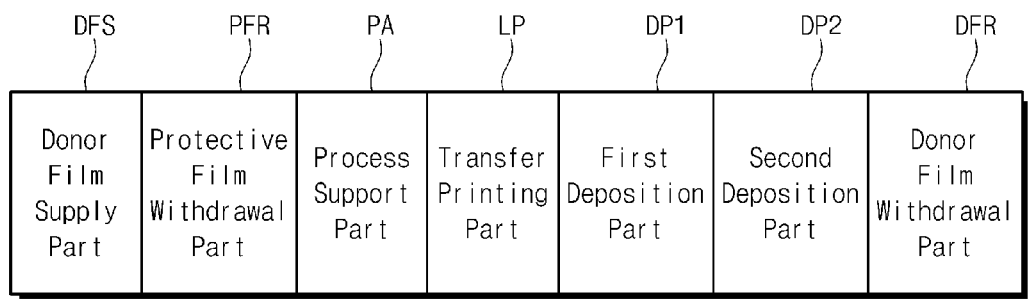
FIGS. 2 and 3 are schematic views showing an embodiment of an organic layer forming apparatus used to form an organic layer of the organic light emitting display shown in FIG. 1.
Figure 3:
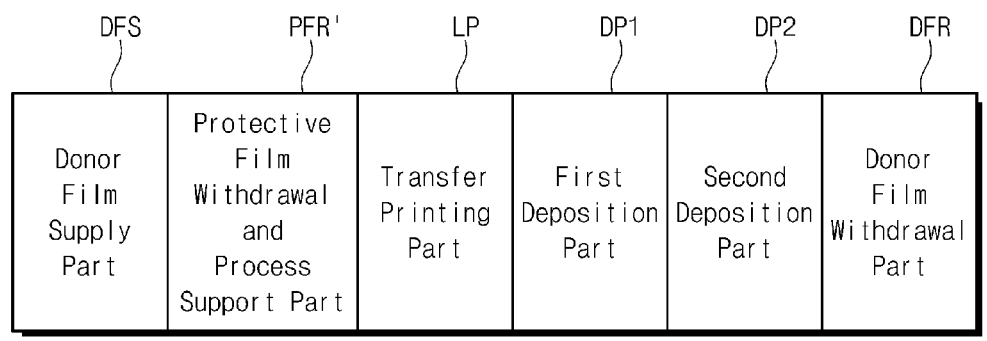

FIGS. 2 and 3 are schematic views showing an organic layer forming apparatus used to form an organic layer of the organic light emitting display shown in FIG. 1.

Referring to FIGS. 2 and 3, the organic layer forming apparatus is used to form the organic layers disposed on the anode electrode, and the organic layers in each pixel are formed by the deposition process or the transfer printing process.

As shown in FIG. 2, the organic layer forming apparatus includes a donor film supply part DFS, a protective film withdrawal part PFR, a process support part PA, a transfer printing process part LP, a first deposition part DP1, a second deposition part DP2, and a donor film withdrawal part DFR. The donor film supply part DFS, the protective film withdrawal part PFR, the process support part PA, the transfer printing process part LP, the first deposition part DP1, the second deposition part DP2, and the donor film withdrawal part DFR are successively arranged to be connected in series with one another. That is, the organic layer forming apparatus may perform an inline process.

As shown in FIG. 3, the organic layer forming apparatus may include the donor film supply part DFS, a protective film withdrawal and process support part PFR', the transfer printing process part LP, the first deposition part DP1, the second deposition part DP2, and the donor film withdrawal part DFR. That is, the protective film withdrawal and process support part PFR' shown in FIG. 3 simultaneously performs the roles of the protective film withdrawal part PFR and the process support part PA shown in FIG. 2.

Hereinafter, the organic layer forming apparatus will be described in detail.

The donor film supply part DFS supplies a donor film (not shown). For example, the donor film supply part DFS includes a donor film supply roll (not shown) wrapped with the donor film. The donor film supply roll is rotated to supply the donor film to the transfer printing process part LP. The donor film includes a base substrate, a transfer layer disposed on the base substrate, and a protective film protecting the transfer layer.

The protective film withdrawal part PFR is disposed between the donor film supply part DFS and the process support part PA. The protective film withdrawal part PFR separates the protective film used to protect the transfer layer from the donor film and withdraws the protective film. As an example, the protective film withdrawal part PFR includes a protective film wrapping roll to withdraw the protective film. Accordingly, the protective film withdrawal part PFR separates and withdraws the protective film from the donor film before the donor film is supplied to the transfer printing process part LP.

The process support part PA is disposed between the protective film withdrawal part PFR and the transfer printing process LP. The process support part PA is maintained in a low vacuum state to serve as a load-rock chamber. The process support part PA is maintained in the low vacuum state similar to the transfer printing process part LP so as to prevent a transfer substrate, on which the transfer layer is transferred, and the donor film from being damaged.

Meanwhile, the protective film withdrawal and process support part PFR' of the organic layer forming apparatus may simultaneously perform the roles of the protective film withdrawal part PFR and the process support part PA described above.

The transfer printing part LP is disposed between the process support part PA and the first deposition part DP1. The transfer printing part LP irradiates a laser beam onto the base substrate of the donor film from which the protective film is removed so as to transfer the transfer layer irradiated with the laser beam onto the transfer substrate. Thus, a first organic layer is formed on the transfer substrate.

The first deposition part DP1 is disposed between the transfer printing part LP and the second deposition part DP2 and the second deposition part DP2 is disposed between the first deposition part DP1 and the donor film withdrawal part DFR. The first and second deposition parts DP1 and DP2 are maintained in a higher vacuum state than that of the process support part PA and the transfer printing process part LP. The first and second deposition parts DP1 and DP2 perform deposition processes to form second and third organic layers in an area of the transfer substrate except for the area in which the first organic layer is formed. The first deposition part DP1 includes a first mask in which an area thereof is opened to correspond to the area in which the second organic layer is formed and a first deposition source unit accommodating a second organic layer material therein. Accordingly, the first deposition part DP1 forms the second organic layer using the second organic material evaporated from the first deposition source unit. In addition, the second deposition part DP2 includes a second mask in which an area thereof is opened to correspond to the area in which the third organic layer is formed and a second deposition source unit accommodating a third organic layer material therein. Accordingly, the second deposition part DP2 forms the third organic layer using the third organic material evaporated from the second deposition source unit.

The donor film withdrawal part DFR withdraws the donor film carried out from the second deposition part DP2 after the deposition process is completed. The donor film withdrawal part DFR is maintained in a lower vacuum state than that of the first and second deposition parts DP1 and DP2. Therefore, the donor film withdrawal part DFR prevents the transfer substrate applied with the transfer printing process and the organic layer deposition process from being damaged due to external environments.

The organic layer forming apparatus may further include a transfer apparatus, e.g., a conveyor, to transfer the transfer substrate.

As described above, the organic layer forming apparatus forms the organic layers through an inline process by using the donor film supply part DFS, the protective film withdrawal part PFR, the process support part PA, the transfer printing process part LP, the first deposition part DP1, the second deposition part DP2, and the donor film withdrawal part DFR, which are successively arranged to be connected in series. In addition, the transfer printing process part LP forms the first organic layer using the transfer printing process, and the first and second deposition parts DP1 and DP2 form the second and the third organic layers using the deposition process. That is, the organic layer forming apparatus successively performs the transfer printing process and the deposition process to form the first, second, and third organic layers.

Further, since the organic layer forming apparatus removes the protective film from the donor film before the transfer printing process is performed, the transfer layer is prevented from being contaminated.

FIGS. 4 to 10 are cross-sectional views showing a method of manufacturing the organic light emitting display according to an embodiment of the present disclosure. In one embodiment, the rear surface light emitting type display device will be described as an example.

Figure 4:
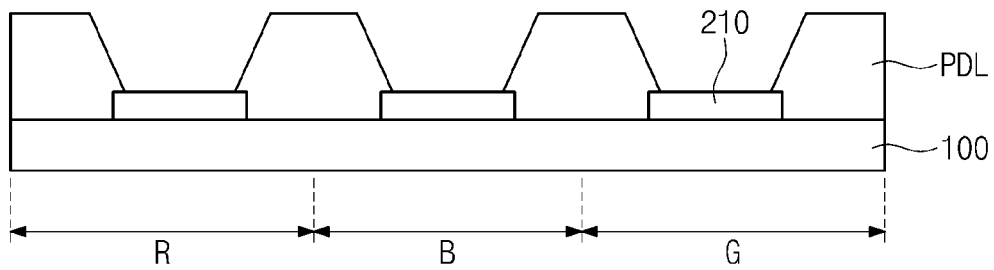
FIGS. 4 to 10 are cross-sectional views showing a method of manufacturing the organic light emitting display according to an embodiment of the present disclosure.

Referring to FIG. 4, the first electrode 210 is formed on the insulating substrate 100.

The insulating substrate 100 may be formed of a transparent insulating material. For instance, the insulating substrate 100 may be a rigid type substrate formed of glass or polymer like plastic. In embodiments where the insulating substrate 100 is a plastic substrate, the insulating substrate 100 may include polyethylene terephthalate (PET), fiber reinforced plastic (FRP), or polyethylene naphthalate (PEN). The insulating substrate 100 may be a transparent flexible type insulating substrate.

The insulating substrate 100 includes the red pixel area R, the green pixel area G, and the blue pixel area B. The insulating substrate 100 includes a driving device, such as, for example, a thin film transistor, disposed in each pixel area R, G, and B.

The first electrode 210 is disposed in each pixel area and electrically connected to the thin film transistor. The first electrode 210 may include a transparent conductive oxide, e.g., indium tin oxide, indium zinc oxide, aluminum zinc oxide, gallium-doped zinc oxide, zinc tin oxide, gallium tin oxide, or fluorine-doped tin oxide.

When the first electrode 210 is formed in each pixel area R, G, and B, the pixel definition layer PDL is formed to expose a portion of the first electrode 210.

Figure 5:
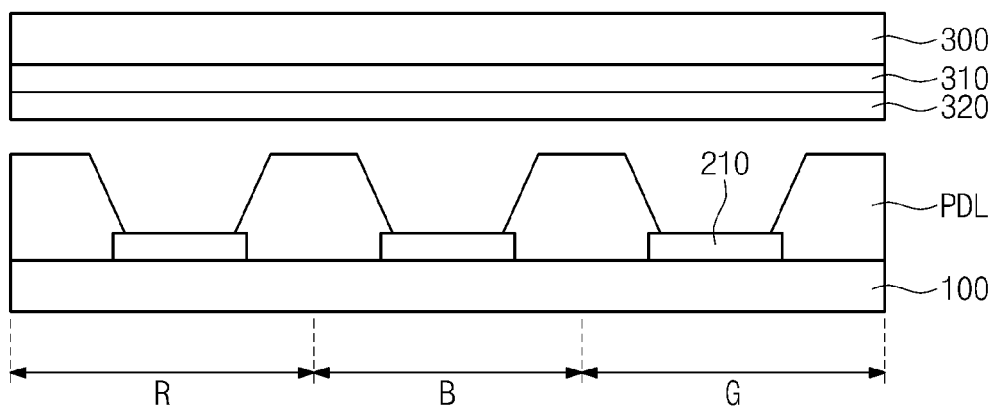

Referring to FIG. 5, the insulating substrate 100 on which the pixel definition layer PDL is formed is entered into the donor film supply part DFS of the organic layer forming apparatus shown in FIG. 2 or 3.

When the insulating substrate 100 is entered into the donor film supply part DFS, the donor film supply roll of the donor film supply part DFS is rotated. Accordingly, the organic layer forming apparatus supplies the donor film while transferring the insulating substrate 100. The donor film includes a base substrate 300, a transfer layer 310 disposed on the base substrate 300, and a protective film 320 disposed on the transfer layer 310 to protect the transfer layer 310 and prevent the transfer layer 310 from being contaminated. In addition, the donor film is provided to allow the protective film 320 to face the first electrode 210.

Figure 6:
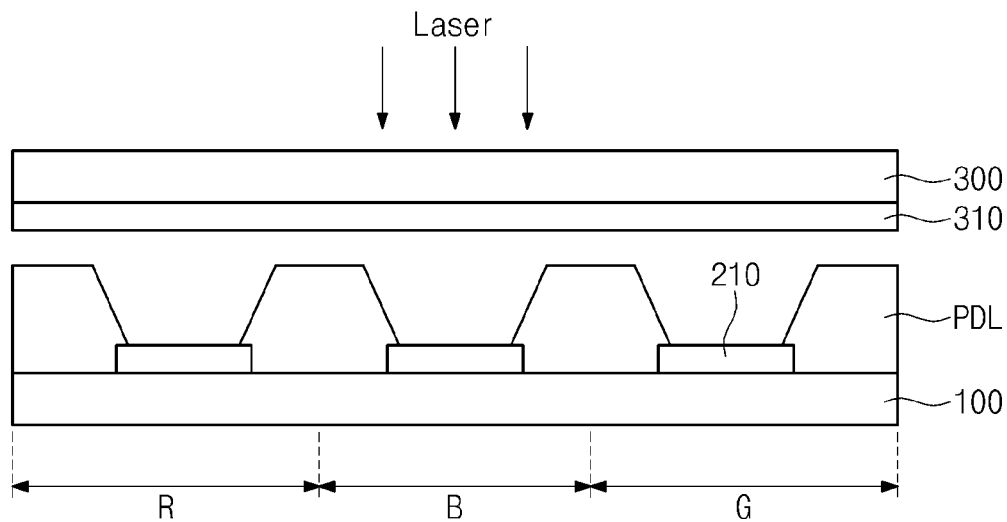

Referring to FIG. 6, the protective film withdrawal part PFR or the protective film withdrawal and process support part PFR' of the organic layer forming apparatus removes the protective film 320 from the donor film.

Thus, the donor film may be provided to the transfer printing process part LP of the organic layer forming apparatus after the protective film 320 is removed.

When the insulating substrate 100 and the donor film are provided to the transfer printing process part LP, the laser beam is irradiated on the area of the base substrate 300 of the donor film.

Figure 7:
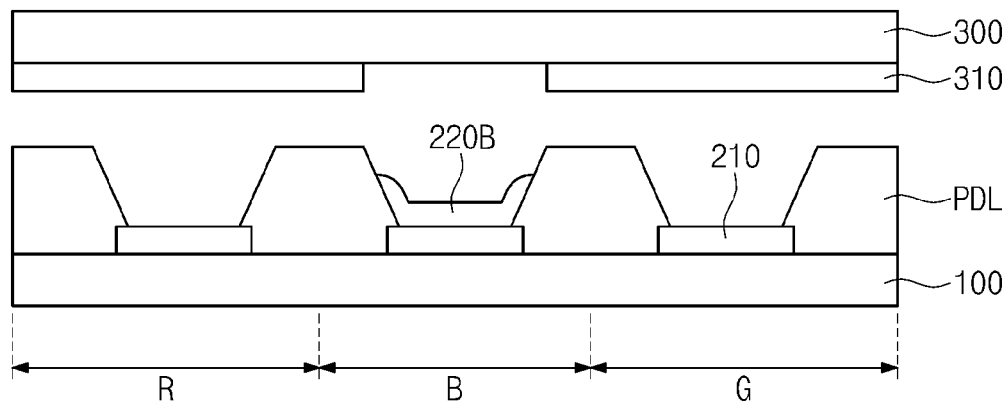

Referring to FIG. 7, the transfer layer 310 in the area on which the laser beam is irradiated is separated from the base substrate 300 and transferred onto the insulating substrate 100. In detail, the transfer layer 310 is transferred onto the first electrode 210 disposed in one of the red, green, and blue pixel areas R, G, and B of the insulating substrate 100, such as, for example, the blue pixel area B, so as to form the first organic layer 220B.

Figure 8:
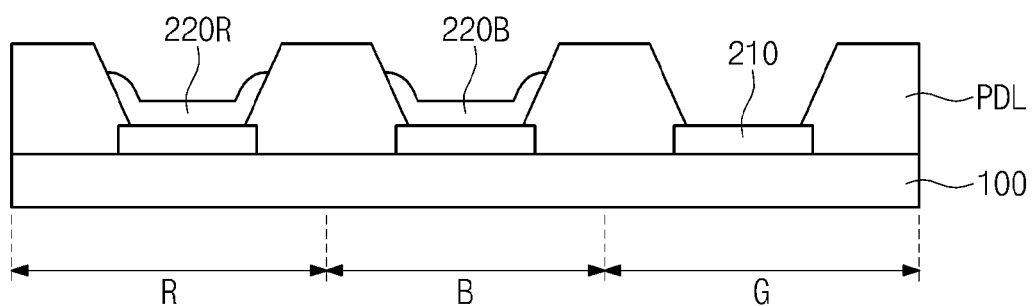

Referring to FIG. 8, the insulating substrate 100 on which the first organic layer 220B is formed is entered into the first deposition part DP1. The organic material is deposited on the first electrode 210 disposed in another one of the red, green, and blue pixel areas R, G, and B of the insulating substrate 100, such as, for example, the red pixel area R, in the first deposition part DP1, thereby forming the second organic layer 220R.

Figure 9:
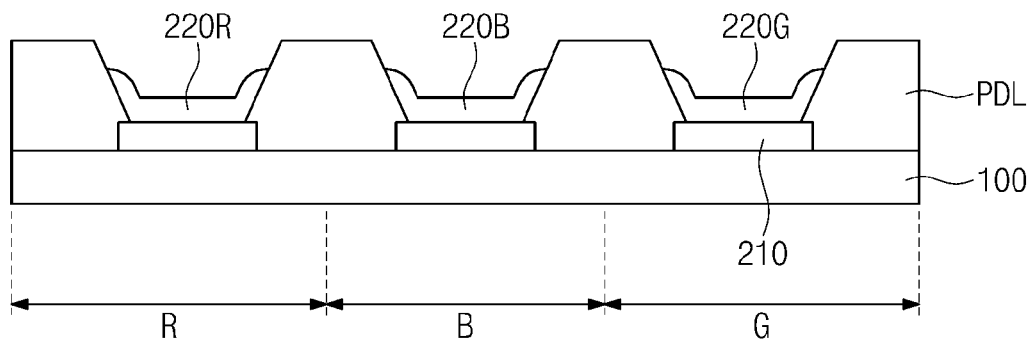

Referring to FIG. 9, the insulating substrate 100 on which the second organic layer 220R is formed is entered into the second deposition part DP2. The organic material is deposited on the first electrode 210 disposed in the other one of the red, green, and blue pixel areas R, G, and B of the insulating substrate 100, such as, for example, the green pixel area R, in the second deposition part DP2, thereby forming the third organic layer 220G.

The insulating substrate 100 on which the third organic layer 220G is formed is entered into the donor film withdrawal part DFR of the organic layer forming apparatus. The donor film is withdrawn by the donor film withdrawal roll in the donor film withdrawal part DFR.

Figure 10:
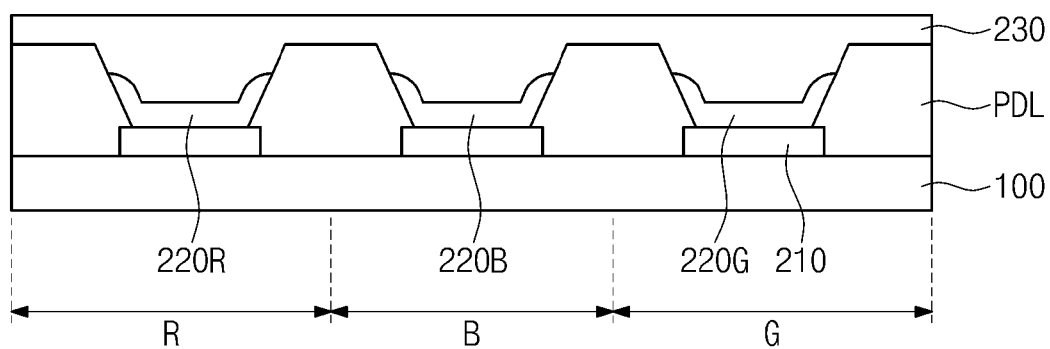

Referring to FIG. 10, the second electrode 230 is formed on the insulating substrate 100 on which the first, second, and third organic layers 220R, 220G, and 220B are formed. Thus, the light emitting devices are respectively formed in the pixel area R, G, and B of the insulating substrate 100.

After the light emitting devices are formed, additional processes may be formed to isolate the light emitting devices from an external environment.

Although certain embodiments of the present invention have been described, it is understood that the present invention should not be limited to these embodiments but various changes and modifications can be made by one of ordinary skill in the art within the spirit and scope of the present invention as hereinafter claimed.

What is claimed is:

1. An apparatus for forming an organic layer, comprising:
    a donor film supply part configured to supply a donor film, the donor film comprising a base substrate, a transfer layer disposed on the base substrate, and a protective film disposed on the transfer layer;
    a protective film withdrawal part configured to remove the protective film from the donor film;
    a transfer printing process part configured to transfer the transfer layer of the donor film onto a transfer substrate to form a first organic layer;
    a first deposition part configured to form a second organic layer on the transfer layer through a first deposition process, on which the first organic layer is formed;
    a second deposition part configured to form a third organic layer on the transfer layer through a second deposition process, on which the second organic layer is formed; and
    a donor film withdrawal part configured to withdraw the donor film,
    wherein the donor film supply part, the protective film withdrawal part, the transfer printing process part, the first deposition part, the second deposition part, and the donor film withdrawal part are successively arranged to be connected in series.

2. The apparatus of claim 1, wherein the transfer substrate is configured to be transferred to the donor film withdrawal part from the donor film supply part after being entered into the donor film supply part.

3. The apparatus of claim 2, wherein the transfer printing process part and the donor film withdrawal part are maintained in a vacuum state lower than a vacuum state at which the first and second deposition parts are maintained.

4. The apparatus of claim 3, further comprising a process support part disposed between the protective film withdrawal part and the transfer printing process part, wherein the process support part is maintained at a vacuum state lower than that the vacuum state at which the first and second deposition parts are maintained.

5. A method of manufacturing an organic light emitting display, comprising:
   providing an insulating substrate to a donor film supply part of an organic layer forming apparatus including the donor film supply part, a protective film withdrawal part, a transfer printing process part, a first deposition part, a second deposition part, and a donor film withdrawal part successively arranged to be connected in series, the insulating substrate including a plurality of pixel areas, wherein a first electrode is formed in the plurality of pixel areas;
   supplying a donor film including a base substrate, a transfer layer disposed on the base substrate, and a protective film disposed on the transfer layer using the donor film supply part;
   removing the protective film using the protective film withdrawal part;
   transferring the transfer layer onto the first electrode in a portion of the pixel areas using the transfer printing process part to form a first organic layer;
   depositing a first organic material onto the first electrode in another portion of the pixel areas using the first deposition part to form a second organic layer;
   depositing a second organic material onto the first electrode in the portion of the pixel areas using the second deposition part to form a third organic layer; and
   withdrawing the donor film using the donor film withdrawal part.

6. The method of claim 5, further comprising irradiating a laser beam onto the base substrate after removing the protective film.

7. The method of claim 5, wherein the transfer printing process part and the donor film withdrawal part are maintained in a vacuum state lower than a vacuum state at which the first and second deposition parts are maintained.

8. The method of claim 5, further comprising a process support part disposed between the protective film withdrawal part and the transfer printing process part, wherein the process support part is maintained at a vacuum state lower than that of a vacuum state at which the first and second deposition parts are maintained.

9. The method of claim 5, further comprising forming a pixel definition layer to expose a portion of the first electrode.

* * * * *